United States Patent
Pieda et al.

(10) Patent No.: US 7,718,025 B2
(45) Date of Patent: May 18, 2010

(54) METHOD OF FORMING FOLDED-STACK PACKAGED DEVICE USING PROGRESSIVE FOLDING TOOL

(75) Inventors: Ruel B. Pieda, Bacoor Cavite (PH); Alan P. De Ocampo, Manila (PH); Rammil Sequido, Manila (PH)

(73) Assignee: Intel Corporation, Santa Clara, CA (US)

( * ) Notice: Subject to any disclaimer, the term of this patent is extended or adjusted under 35 U.S.C. 154(b) by 737 days.

(21) Appl. No.: 11/478,111

(22) Filed: Jun. 28, 2006

(65) Prior Publication Data
US 2006/0243375 A1 Nov. 2, 2006

Related U.S. Application Data

(62) Division of application No. 10/261,335, filed on Sep. 30, 2002, now Pat. No. 7,089,984.

(51) Int. Cl.
*B29C 65/20* (2006.01)
*B29C 65/51* (2006.01)

(52) U.S. Cl. ...................................... 156/227
(58) Field of Classification Search ........................ None
See application file for complete search history.

(56) References Cited

U.S. PATENT DOCUMENTS

| | | | |
|---|---|---|---|
| 1,721,975 A | | 7/1929 | Sanderson |
| 1,725,975 A | | 8/1929 | Bystricky |
| 4,272,235 A | * | 6/1981 | Barnett ......................... 425/397 |
| 4,421,500 A | * | 12/1983 | Smith ........................... 493/405 |
| 4,530,729 A | * | 7/1985 | Fuchs et al. .................. 156/217 |
| 4,599,080 A | * | 7/1986 | Tada et al. .................... 493/267 |
| 5,573,622 A | * | 11/1996 | Hass et al. .................... 156/289 |
| 5,776,797 A | * | 7/1998 | Nicewarner et al. ......... 438/107 |

* cited by examiner

*Primary Examiner*—Richard Crispino
*Assistant Examiner*—Barbara J. Musser
(74) *Attorney, Agent, or Firm*—Blakely, Sokoloff, Taylor & Zafman LLP

(57) ABSTRACT

An embodiment of the present invention includes a plunger, a heating element, and first and second arms. The plunger affixes a first unit to a second unit with adhesive. The first and second units are on a strip of a flexible tape. The strip is on a folding base unit. The folding base unit folds the first unit on top of the second unit. The heating element is attached to the plunger to cure the adhesive. The first and second arms are positioned on first and second sides of the plunger via first and second hinges, respectively, to secure the first and second units underneath the plunger. Another embodiment of the invention includes a first sub-assembly and a second sub-assembly. The first sub-assembly supports a first unit. The first sub-assembly, when activated, folds the first unit on top of a second unit. The first and second units are on a strip of a flexible tape. The second sub-assembly supports the second unit.

12 Claims, 13 Drawing Sheets

METHOD OF FORMING FOLDED-STACK PACKAGED DEVICE USING PROGRESSIVE FOLDING TOOL

CROSS-REFERENCES TO RELATED APPLICATIONS

This is a Divisional Application of U.S. patent application Ser. No. 10/261,335, filed Sep. 30, 2002 now U.S. Pat. No. 7,089,984. This Divisional Application claims the benefit of the U.S. patent application Ser. No. 10/261,335.

BACKGROUND

1. Field

Embodiments of the invention relate to the field of packaging, and more specifically, to folded-stack packaging.

2. Background

Chip scale technology offers many advantages in electronics packaging. One emerging packaging technique in chip scale technology is micro ball grid array (μBGA) packaging. μBGA provides the smallest size, highest performance, and best reliability of currently available packages. Folded-stack (fs) μBGA further improves board density and reliability.

Existing techniques for folded-stack packaged devices are typically manual, requiring boat-to-boat handling from singulation process to cure process. These techniques have a number of drawbacks. First, the process is slow and cumbersome. The packaged device units are processed through a number of discrete operations: saw singulation, first boat handling, folding and adhere, second boat handling, folding and curing, and then traying. Second, it is expensive because several components (e.g., jigs) are needed.

BRIEF DESCRIPTION OF THE DRAWINGS

The invention may best be understood by referring to the following description and accompanying drawings that are used to illustrate embodiments of the invention. In the drawings.

DESCRIPTION

An embodiment of the present invention includes a plunger, a heating element, and first and second arms. The plunger affixes a first unit to a second unit with adhesive. The first and second units are on a strip of a flexible tape. The strip is on a folding base unit. The folding base unit folds the first unit on top of the second unit. The heating element is attached to the plunger to cure the adhesive. The first and second arms are positioned on first and second sides of the plunger respectively, to secure the first and second units underneath the plunger. Another embodiment of the invention includes a first sub-assembly and a second sub-assembly. The first sub-assembly supports a first unit. The first sub-assembly, when activated, folds the first unit on top of a second unit. The first and second units are on a strip of a flexible tape. The second sub-assembly supports the second unit.

In the following description, numerous specific details are set forth. However, it is understood that embodiments of the invention may be practiced without these specific details. In other instances, well-known circuits, structures, and techniques have not been shown in order not to obscure the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, etc.

Figure 1:
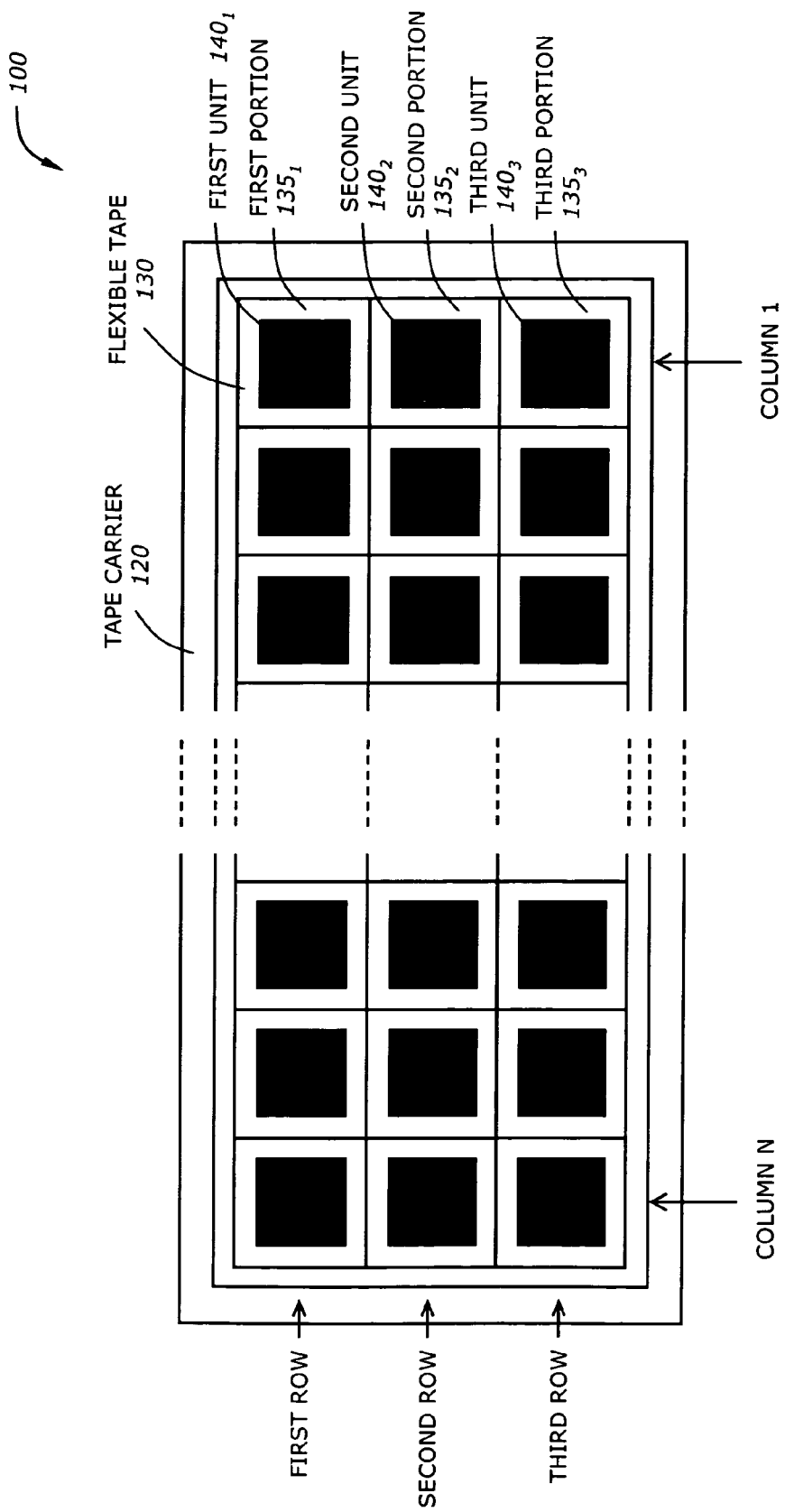
FIG. 1 is a diagram illustrating a micro ball grid array (μBGA) packaging layout according one embodiment of the invention.

FIG. 1 is a diagram illustrating a micro ball grid array (μBGA) packaging layout 100 according to one embodiment of the invention. The layout 100 includes a tape carrier 120, and a flexible tape 130.

The tape carrier 120 is typically a metal frame to carry a number of packaged devices affixed on the flexible tape 130. The flexible tape 130 is a rectangular tape that can be flexibly folded. The flexible tape 130 may be a double-sided polyimide tape (e.g., Kapton or Upilex) having a thickness of about 10 μm to 75 μm. The packaged devices are affixed on the flexible tape 130 in a number of rows and columns. In one embodiment, there are three rows and N columns. Typically values of N are 16, 20, 24, 32, etc.

Each column corresponds to a strip of the flexible tape 130 and includes three units: the first unit $140_1$, the second unit $140_2$, and the third unit $140_3$. Each of the units includes a die affixed to a corresponding portion of the flexible tape 130. For example, the first unit $140_1$, the second unit $140_2$, and the third unit $140_3$ include a first die, a second die, and a third die, respectively, affixed to a first portion $135_1$, a second portion $135_2$, and a third portion $135_3$, respectively, of the strip. Each side of the flexible tape 130 may have a metal layer that has leads and/or interconnections between the die. The die may be any semiconductor chip or devices such as memory device, flash memory, static random access memory (SRAM), dynamic random access memory (DRAM), logic devices, processing elements, etc. The die are affixed to the flexible tape 130 with die-attaching materials based on silicon or epoxy. The die may also be lead-bonded and encapsulated. The die are attached to the strip by solder balls.

The packaged devices on the flexible tape 130 are packaged and processed according to traditional packaging techniques. In one embodiment, the packaging technique is the μBGA. The packaged devices on each strip or column are folded in a stacking manner to form a folded-stack μBGA. In the following description, for illustrative purposes, the packaged device will be referred to as a folded-stack μBGA. It is contemplated that the packaged device may use any suitable packaging techniques.

Figure 2:
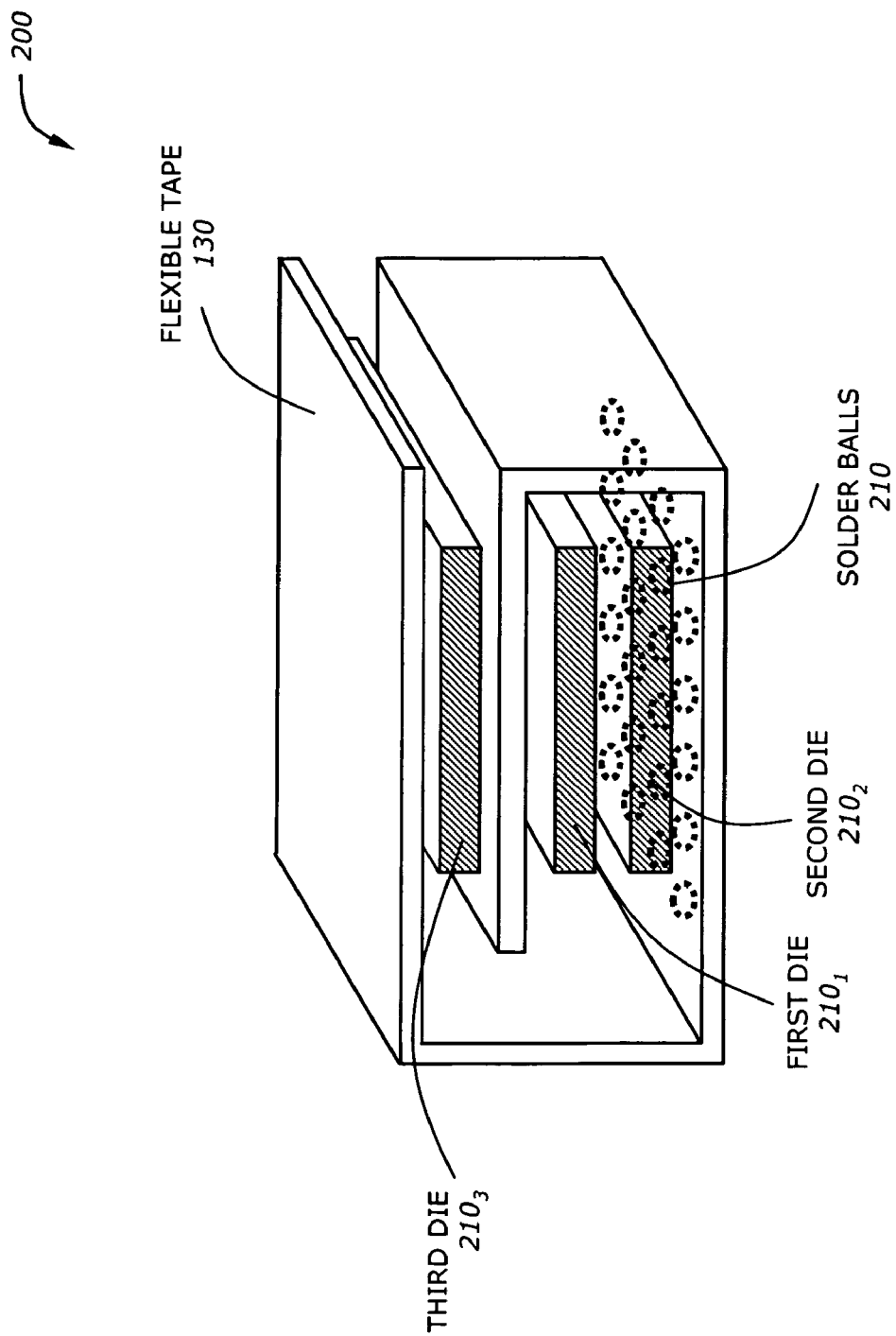
FIG. 2 is a diagram illustrating a folded-stack μBGA packaged device according to one embodiment of the invention.

FIG. 2 is a diagram illustrating a folded-stack μBGA packaged device 200 according to one embodiment of the invention.

The folded-stack device 200 includes first, second, and third die $210_1$, $210_2$, and $210_3$, respectively, and the flexible tape 130. As discussed above, the first, second, and third die $210_1$, $210_2$, and $210_3$ are attached to the flexible tape 130 via solder balls 210. The solder balls 210 are micro grid array of soldering materials attached to the pads on the flexible tape 130. The flexible tape 130 is folded in two folds. In the first fold, the first die $210_1$ is positioned such that its surface is affixed to the surface of the second die $210_2$ by an adhesive. The affixed first and second die $210_1$ and $210_2$ form a partially folded unit. In the second fold, the third portion of the flexible tape 130 attaching to the third die $210_3$ is folded on top of the partially folded unit. The surface of the third die $210_3$ is affixed to the bottom side of the first portion of the flexible tape 130 by adhesive.

The folded-stack μBGA packaged device 200 as formed is compact and provides high density and high reliability on a printed circuit board. The process to fold the μBGA packaged device 200 is performed in a progressive manner in an assembly line that includes several stations. The folding process is efficiently performed by using a tool assembly for folding, affixing, and curing.

Figure 3:
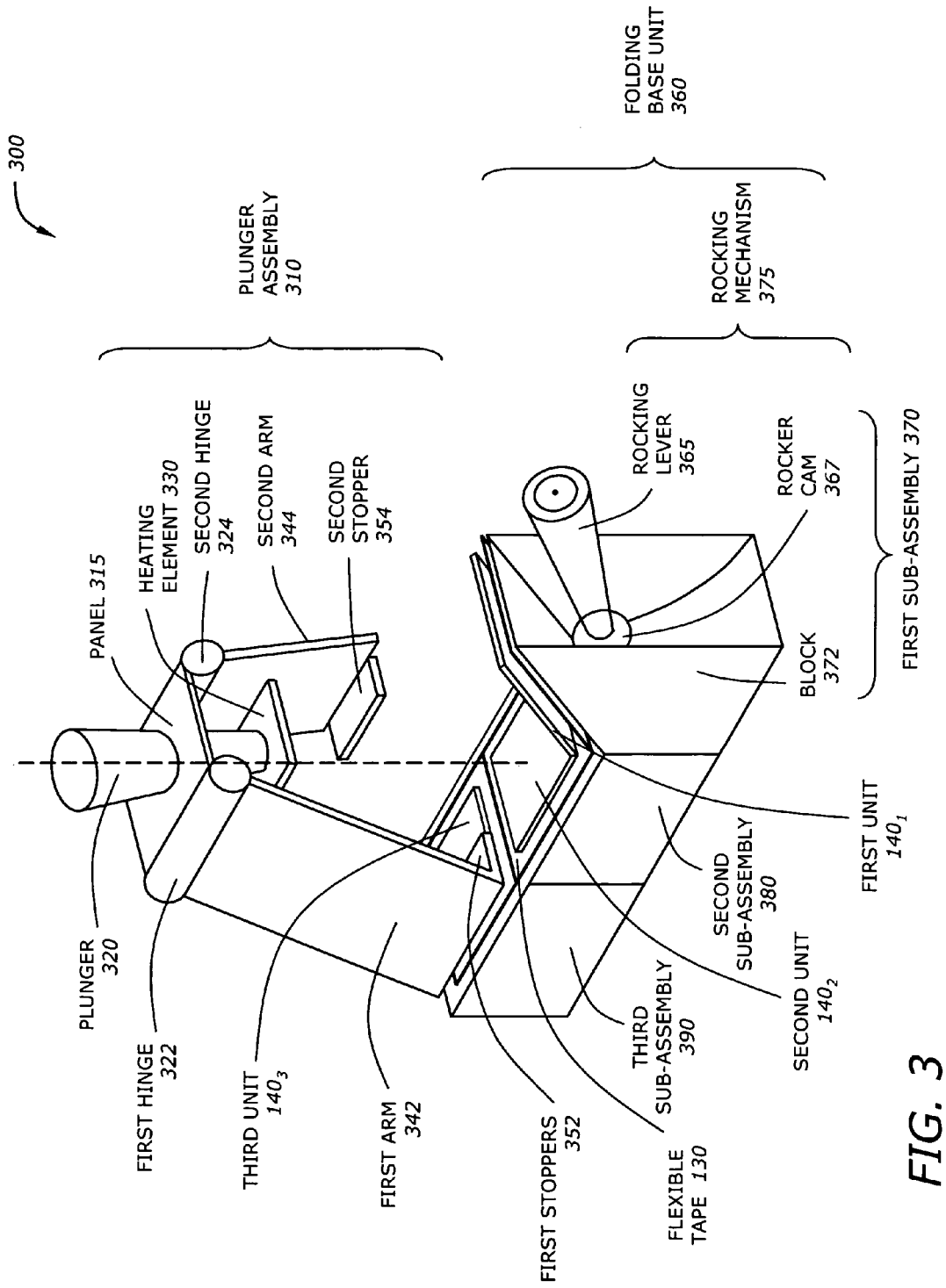
FIG. 3 is a diagram illustrating a tool assembly according to one embodiment of the invention.

FIG. 3 is a diagram illustrating a tool assembly 300 according to one embodiment of the invention. The tool assembly 300 includes a plunger assembly 310 and a folding base unit 360. The tool assembly 300 operates on a strip of the flexible tape 130 (shown in FIG. 1) which carries the first, second, and third units $140_1$, $140_2$, and $140_3$, respectively.

The plunger assembly 310 includes a panel 315, a plunger 320, a heating element 330, and two arms 342 and 344. The panel 315 is a rectangular or square plate of suitable material such as metal. The panel 315 has a hole located in the middle to allow the plunger to travel up and down. The plunger 320 is a rod of sufficient length and is made of suitable material such as metal. The rod may be of any suitable shape such as cylinder. In the initial, or home position, the plunger 320 is retracted upward. The position shown in FIG. 3 is when the plunger 320 is about half way down, or half way up. The plunger 320 may move upward and downward through the hole of the panel 315 under action of an activation unit (not shown). When forced to move downward, the plunger 320 affixes the first unit $140_1$ to the second unit $140_2$ with adhesive. The first unit $140_1$ is folded to be on top of the second unit $140_2$ by the folding base unit 360.

The heating element 330 is attached to the plunger 320 at a distal end. The heating element 330 may also be integral to the plunger 320. The heating element 330 is made of thermally conducting material such as metal or alloy. Heat may be generated by applying an electrical voltage across wires internal to the heating element 330. The heating element 330 thermally cures the adhesive between the first and second units $140_1$ and $140_2$.

The first and second arms 342 and 344 are positioned on the first and second sides of the plunger 320 around the panel 315 via first and second hinges 322 and 324, respectively. They are used to align the first unit $140_1$ when folded op top of the second unit $140_2$ and when the third unit $140_3$ is folded on top of the folded first unit $140_1$. The first and second arms 342 and 344 move around the first and second hinges 322 and 324. The position shown in FIG. 3 is an open position. In the initial, or home position, the first and second arms 342 and 344 are in a closed position when they are approximately vertical and directly facing to each other. A cam mechanism is used to mechanically connect the vertical movement of the plunger 320 and the swinging movement of the first and second arms 342 and 344. When the plunger 320 extends downward, the first and second arms 342 and 344 swing open. When the plunger 320 retracts upward, they swing closed. When they move inward toward each other, they secure the first and second units $140_1$ and $140_2$ underneath the plunger 320. This is typically done when the plunger 320 moves downward to press on the folded first unit $140_1$ and the second unit $140_2$. The first and second arms 342 and 344 extend outward around the first and second hinges 322 and 324, respectively, to release the first and second units $140_1$ and $140_2$ so that they can be transferred or moved to the next area. This can be done when the plunger 320 moves upward after affixing and curing the first and second units $140_1$ and $140_2$. The first and second arms 342 and 344 may extend under some spring action that is activated when the plunger 320 moves upward.

The first and second arms 342 and 344 may also have first and second stoppers 352 and 354, respectively, facing inward toward the plunger 320. The first and second stoppers 352 and 354 act as a guide slot to secure units in place to be folded and affixed. For illustrative purposes, the second stopper 354 is shown to be above the first stopper 352, just enough to hold down the folded units on the sides of the flexible tape and not touching the mold unit. The exact location of the stoppers 352 and 354 on the first and second arms 342 and 344, respectively, depends on the thickness of the unit to be folded and affixed.

The folding base unit 360 provides support for the flexible tape 130 and the first, second, and third units $140_1$, $140_2$, and $140_3$. The plunger assembly 310 is typically positioned to be directly above the middle row, or the second unit $140_2$. The folding base unit 360 also folds the first unit $140_1$ on top of the second unit $140_2$ to form a partially folded unit in a first folding phase. In a second folding phase, the folding base unit 360 folds the third unit $140_3$ on top of the partially folded unit. Note that when used in two separate phases, there may be two separate tool assemblies 200, one for the first folding phase and one for the second folding phase. The tool assemblies 200 for the two phases are almost identical. The differences may include the dimensions, the location of the stoppers 352 and 354, the travel length of the plunger 320 (which may be adjusted), and the orientation of the folding base unit 360, etc. Conceptually, therefore, the folding base unit 360 may be considered as a unit to fold a "first unit" on top of a "second unit". In the first folding phase, the "first unit" is the first unit $140_1$ and the "second unit" is the second unit $140_2$. In the second folding phase, the "first unit" is the third unit $140_3$ and the "second unit" is the partially folded unit including the first unit $140_1$ affixed to the second unit $140_2$.

The folding base unit 360 includes first, second, and third sub-assemblies 370, 380, and 390 to support the first, second, and third units $140_1$, $140_2$, and $140_3$, respectively. These sub-assemblies may be interconnected together by some interconnection mechanism. Alternatively, they may be integrated together in a single unit.

The first sub-assembly 370, when activated, folds the first unit on top of the second unit. As noted above, when the folding base unit 360 is used in the first folding phase, the first unit to be folded is the first unit $140_1$ and the second unit is the second unit $140_2$. When the folding base unit 360 is used in the second folding phase, it folds the third unit $140_3$ on top of the partially folded unit. It should also be noted that in the first folding phase, the correspondence between the sub-assemblies and the units on the flexible tape 130 is reverse from that in the second folding phase. In the first folding phase, the first, second, and third sub-assemblies 370, 380, and 390 support the first, second, and third units $140_1$, $140_2$, and $140_3$. In the second folding phase, the first and second sub-assemblies 370 and 380 support the third unit $140_3$ and the partially folded unit (formed by the first unit $140_1$ affixed to the second unit $140_2$). Normally, in the second folding phase, the third sub-assembly 390 is not required.

The first sub-assembly 370 includes a block 372 and a rocking mechanism 375. The block 372 is an angles block having a slanted surface to provide a resting position for the first unit $140_1$ in the first folding phase (or the third unit $140_3$ in the second folding phase). In the following discussion, for clarity, references will be made to the first unit and the second unit without reference numerals. It should be understood that when used in the first folding phase, the term "first unit" refers to the first unit $140_1$ and the term "second unit" refers to the second unit $140_2$. When used in the second folding phase, the term "first unit" refers to the third unit $140_3$ and the term "second unit" refers to the partially folded unit. The inclination or slope of the slanted surface depends on the dimensions of the first unit $140_1$ and the mechanical characteristics of the rocking mechanism 375. In general the slope of the slanted surface is such that the folding action performed by the rocking mechanism 375 is facilitated. The steeper the slope, the less force the rocking mechanism 375 is exerted on the first unit. The block 372 has a hollow or vacuum space beneath the slanted surface to provide housing for the rocking mechanism 375. The rocking mechanism 375 includes a rocking lever 365 and a cam 367. The rocking lever 365, when activated, causes the cam 367 to move or rotate to push the first unit from the resting position to fold the first unit on top of the second unit.

Figure 4A:
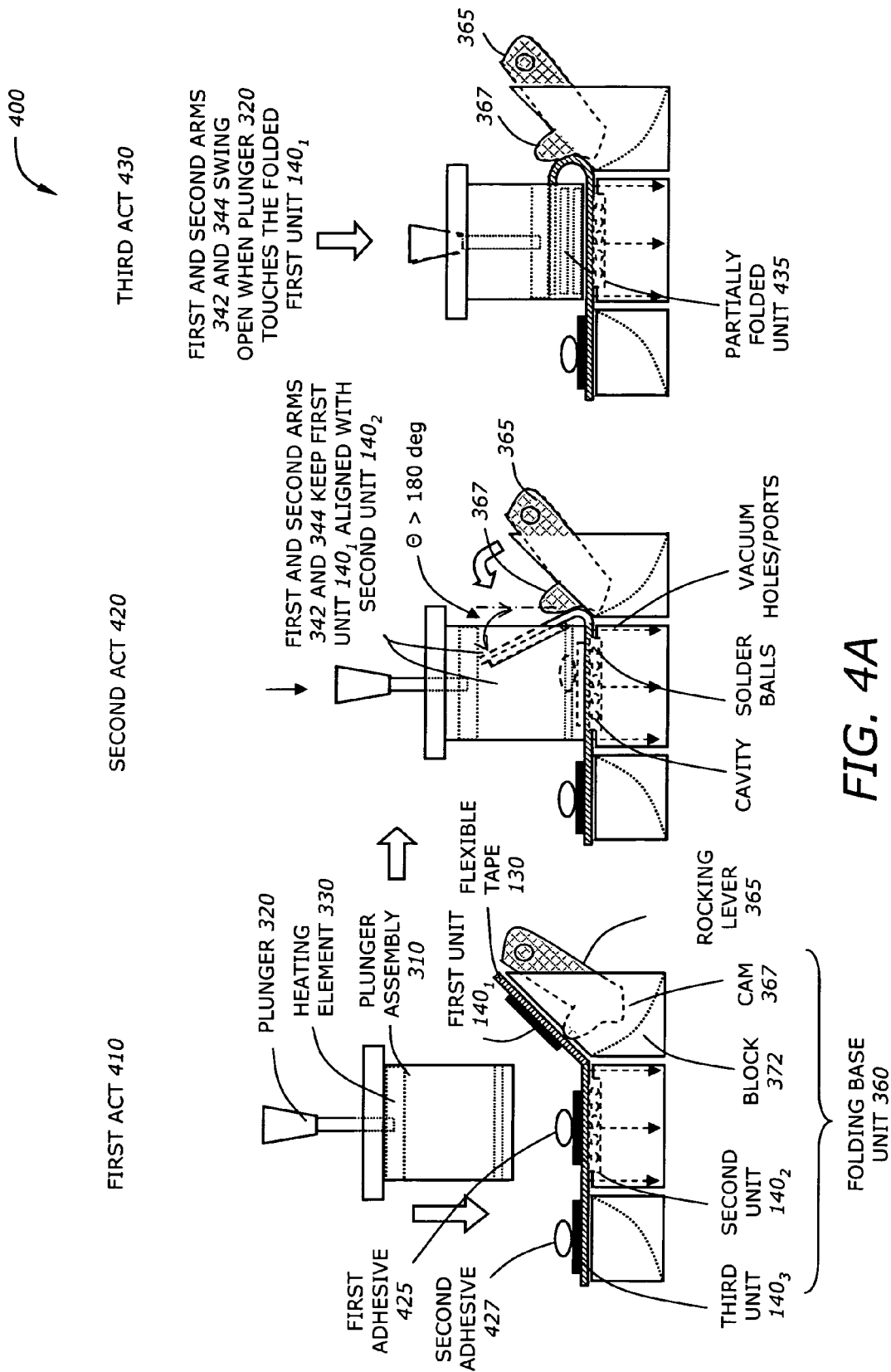
FIG. 4A is a diagram illustrating a first folding phase for the μBGA packaged device according to one embodiment of the invention.

FIG. 4A is a diagram illustrating a first folding phase 400 for the μBGA packaged device according to one embodiment of the invention. The first folding phase 400 includes a first act 410, a second act 420, a third act 430, a fourth act 440, and a fifth act 450.

In the first act 410, the strip of the flexible tape 130 with the three units $140_1$, $140_2$, and $140_3$ is on the folding base unit 360. In addition, the first unit $140_1$ has been punched out. The plunger assembly 310 is positioned directly above the second sub-assembly 380. A first adhesive 425 and a second adhesive 427 are dispensed on the surface of the second unit $140_2$ and the surface of the third unit $140_3$, respectively.

In the second act 420, the rocking lever 365 is activated to rotate the cam 367. The cam 367 pushes the first unit $140_1$ out of the resting position to be folded on top of the second unit $140_2$. The first and second arms 342 and 344 help keeping the first unit $140_1$ being bent or folded aligned with the second unit $140_2$. The plunger assembly 310 then moves down.

In the third act 430, the plunger assembly 310 secures the partially folded unit with its two arms. The surface of the first unit $140_1$ is in contact with the surface of the second unit $140_2$. The first adhesive 425 acts to glue the two units together to form a partially folded unit 435. The plunger 320 of the plunger assembly 310 is then activated to move downward to apply sufficient force on the first unit $140_1$ to affix the first unit $140_1$ to the second unit $140_2$. The heating element 330 then generates heat to thermally cure the adhesive 425.

Figure 4B:
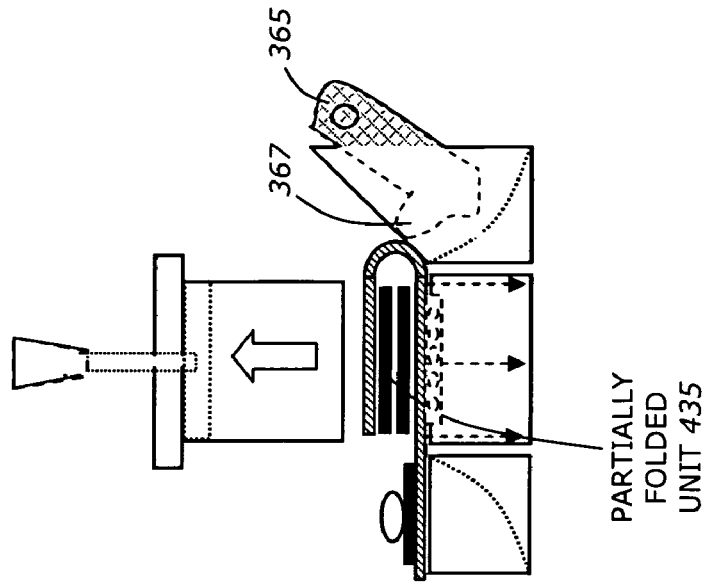
FIG. 4B is a diagram illustrating continuation of the first folding phase for the μBGA packaged device according to one embodiment of the invention.
Figure 4B:
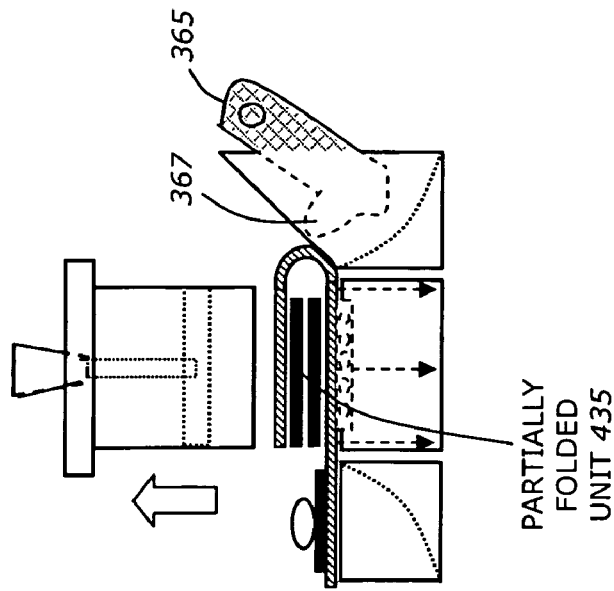

FIG. 4B is a diagram illustrating continuation of the first folding phase for the μBGA packaged device according to one embodiment of the invention. The continuation includes a fourth act 440 and a fifth act 450. In the fourth act 440, the plunger assembly 310 is moved upward while the plunger 320 is still down. In the fifth act 450, the plunger 320 is retracted upward to the home position. This concludes the first folding phase.

Figure 4C:
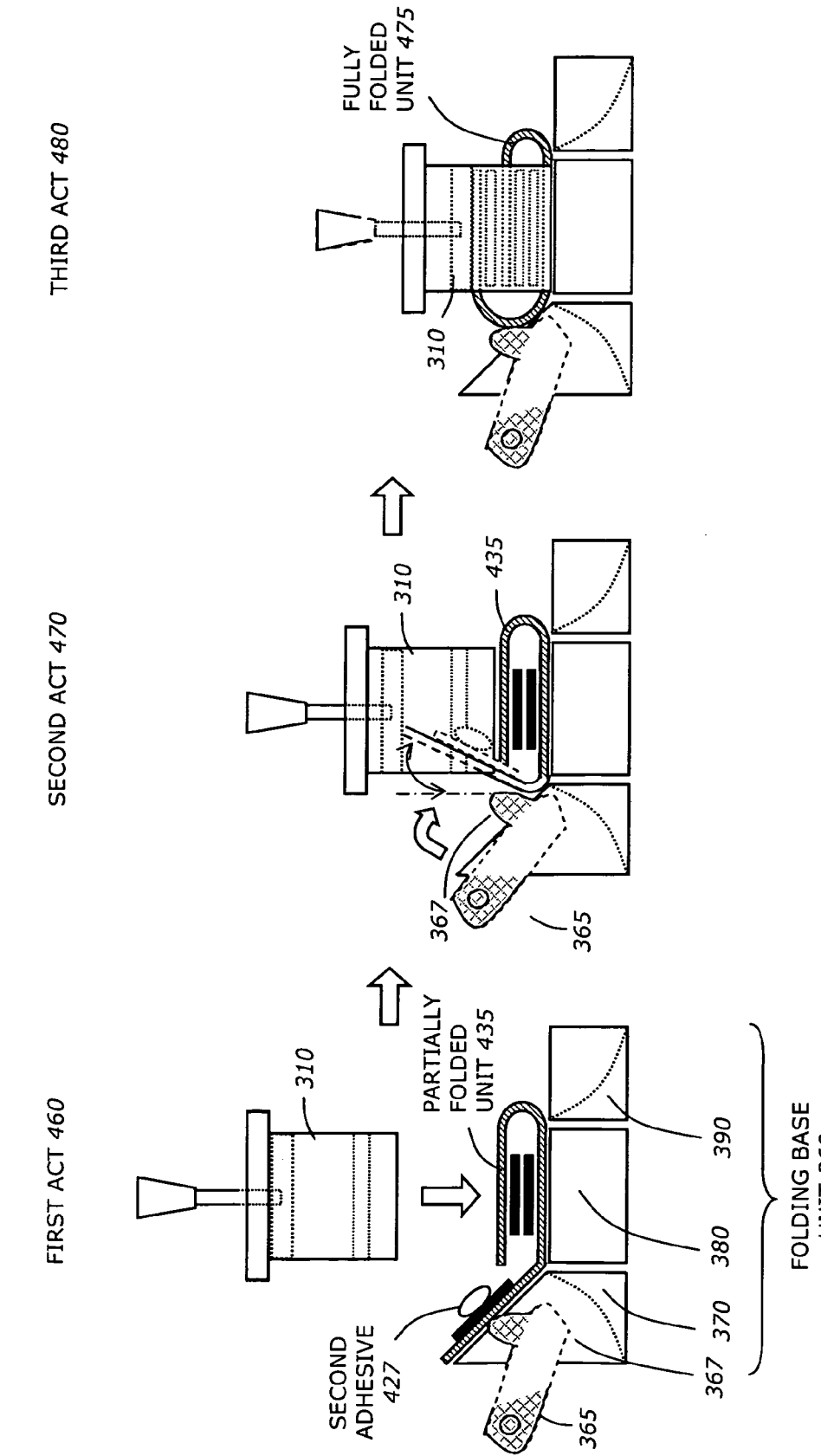
FIG. 4C is a diagram illustrating a second folding phase for the μBGA packaged device according to one embodiment of the invention.

FIG. 4C is a diagram illustrating a second folding phase 455 for the μBGA packaged device according to one embodiment of the invention. The second folding phase 455 includes a first act 460, a second act 470, a third act 480, a fourth act 490, and a fifth act 495. Note that in the second folding phase, the strip with the third unit $140_3$ and the partially folded unit 435 has been transferred from the first folding phase to the folding base unit such that the third unit $140_3$ rests on the slanted surface of the first sub-assembly 370 and the partially folded unit 435 is on the second sub-assembly 380. The third unit $140_3$ has been punched out.

In the first act 460, the plunger assembly 310 is positioned directly above the second sub-assembly 380. The second adhesive remains on the surface of the third unit $140_3$. In the second act 470, the rocking lever 365 is activated to cause the cam 367 to rotate to push the third unit $140_3$ toward the partially folded unit 435 such that the third unit $140_3$ is folded on the bottom of the second portion of the strip to form a fully folded unit 475. The plunger assembly 310 moves toward the partially folded unit 435. In the third act 480, the plunger assembly 310 secures the fully folded unit by the two arms. The plunger 320 then moves downward to exert sufficient force on the third unit $140_3$ to affix the third unit $140_3$ to the partially folded unit via the second adhesive 427. The heating element 330 then generates heat to thermally cure the second adhesive 427 and the entire folded unit. After the third act 480, the plunger assembly 310 moves upward and the two arms extend to release the fully folded unit.

Figure 4D:
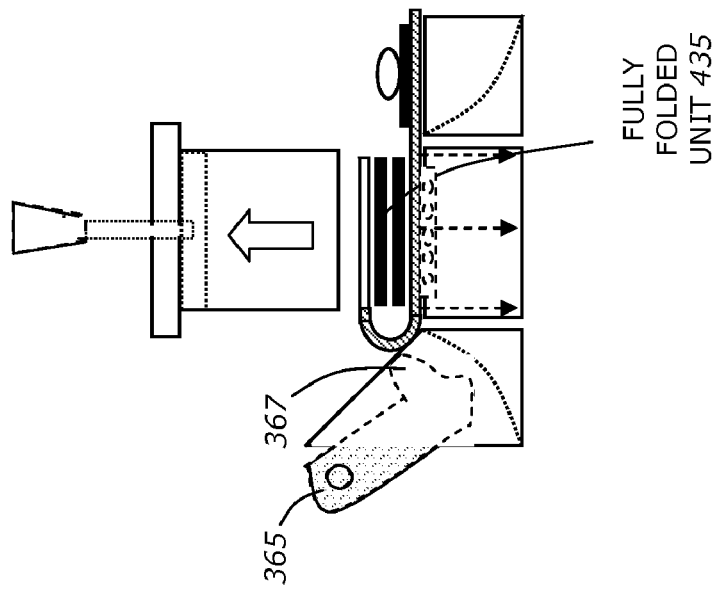
FIG. 4D is a diagram illustrating continuation of the second folding phase for the μBGA packaged device according to one embodiment of the invention.
Figure 4D:
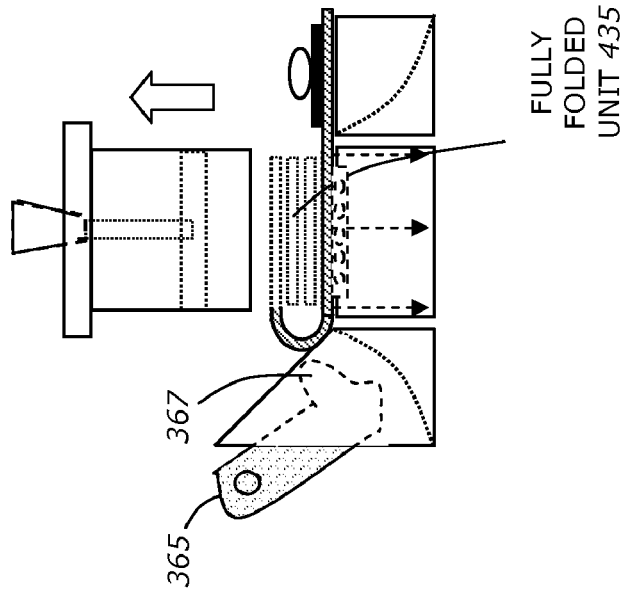

FIG. 4D is a diagram illustrating continuation of the second folding phase for the μBGA packaged device according to one embodiment of the invention. The continuation includes the fourth act 490 and the fifth act 495. In the fourth act 490, the plunger assembly 310 is moved upward while the plunger 320 is still down. In the fifth act 495, the plunger 320 is retracted upward to the home position. This concludes the second folding phase.

Figure 5:
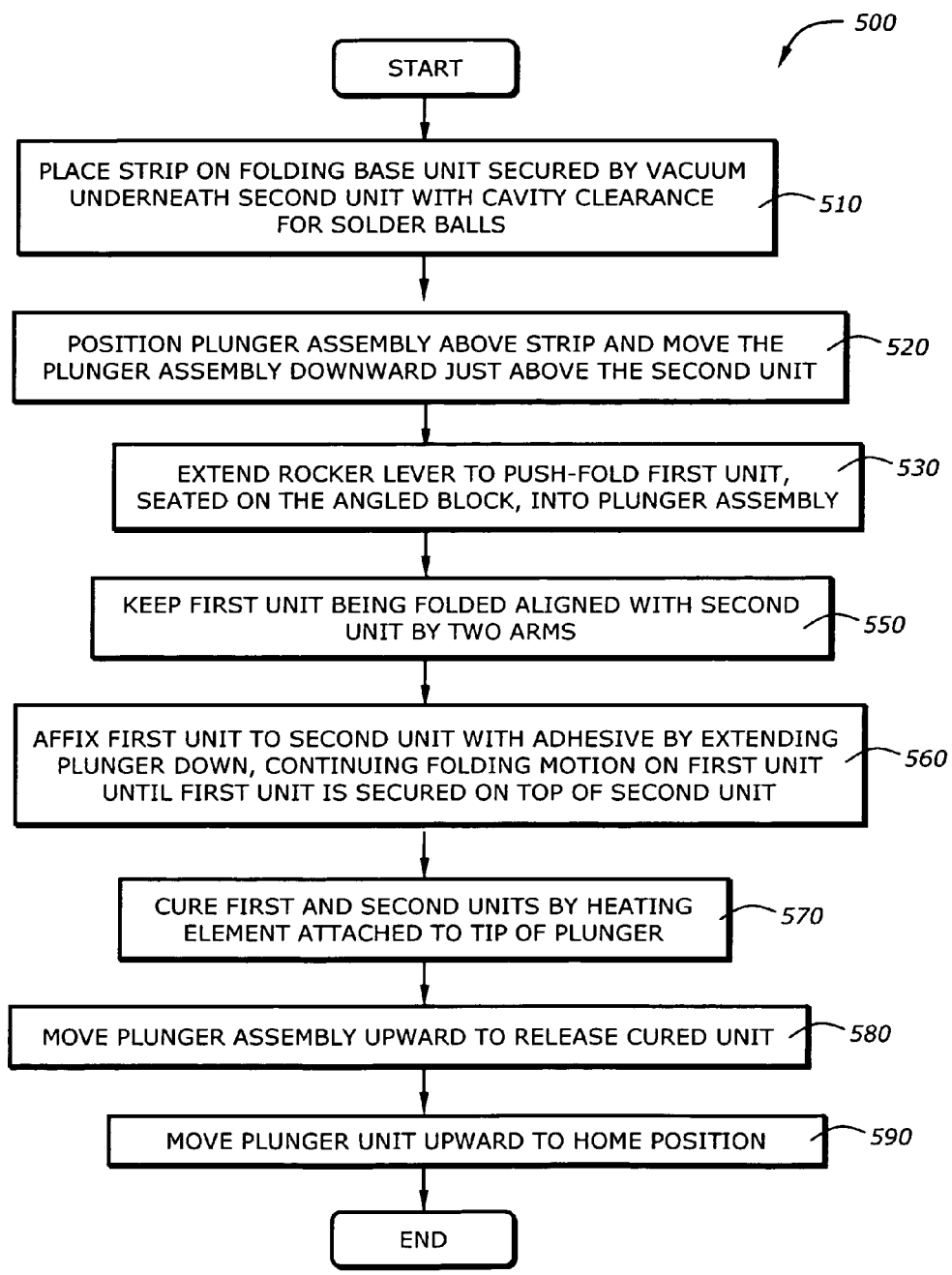
FIG. 5 is a flowchart illustrating a process to fold the μBGA packaged device according to one embodiment of the invention.

FIG. 5 is a flowchart illustrating a process 500 to fold the μBGA packaged device according to one embodiment of the invention. Note that the process 500 is applicable for both the first folding phase and the second folding phase. Again, the terms "first unit" and "second unit" are interpreted accordingly as discussed above.

Upon START, the process 500 places the strip of the three units on the folding base unit secured by vacuum underneath the second unit with cavity clearance for the solder balls (Block 510). Next, the process 500 positions the plunger assembly directly above the second unit of the strip and moves the plunger assembly downward just above the second unit (Block 520). Then, the process 500 extends the rocker lever to push-fold the first unit, seated on the slanted or angled block, into the plunger assembly (Block 530). The first unit is to be folded on top of the second unit.

Then, the process 500 keeps the first unit being folded and aligned with the second unit by the two arms (Block 550). Next, the process 500 affixes the first unit to the second unit with the adhesive by extending the plunger down (Block 560). The plunger continues the folding motion on the first unit until the first unit is secured on top of the second unit.

Then, the process 500 cures adhesive and the first and second units by the heating element attached to the tip of the plunger (Block 570). Next, the process 500 moves the plunger assembly upward to release the cured unit (Block 580). The folded first and second units are now ready to be transferred or moved to other area. Then, the process 500 moves the plunger upward to the home position (Block 590). The process 500 is then terminated.

Figure 6:
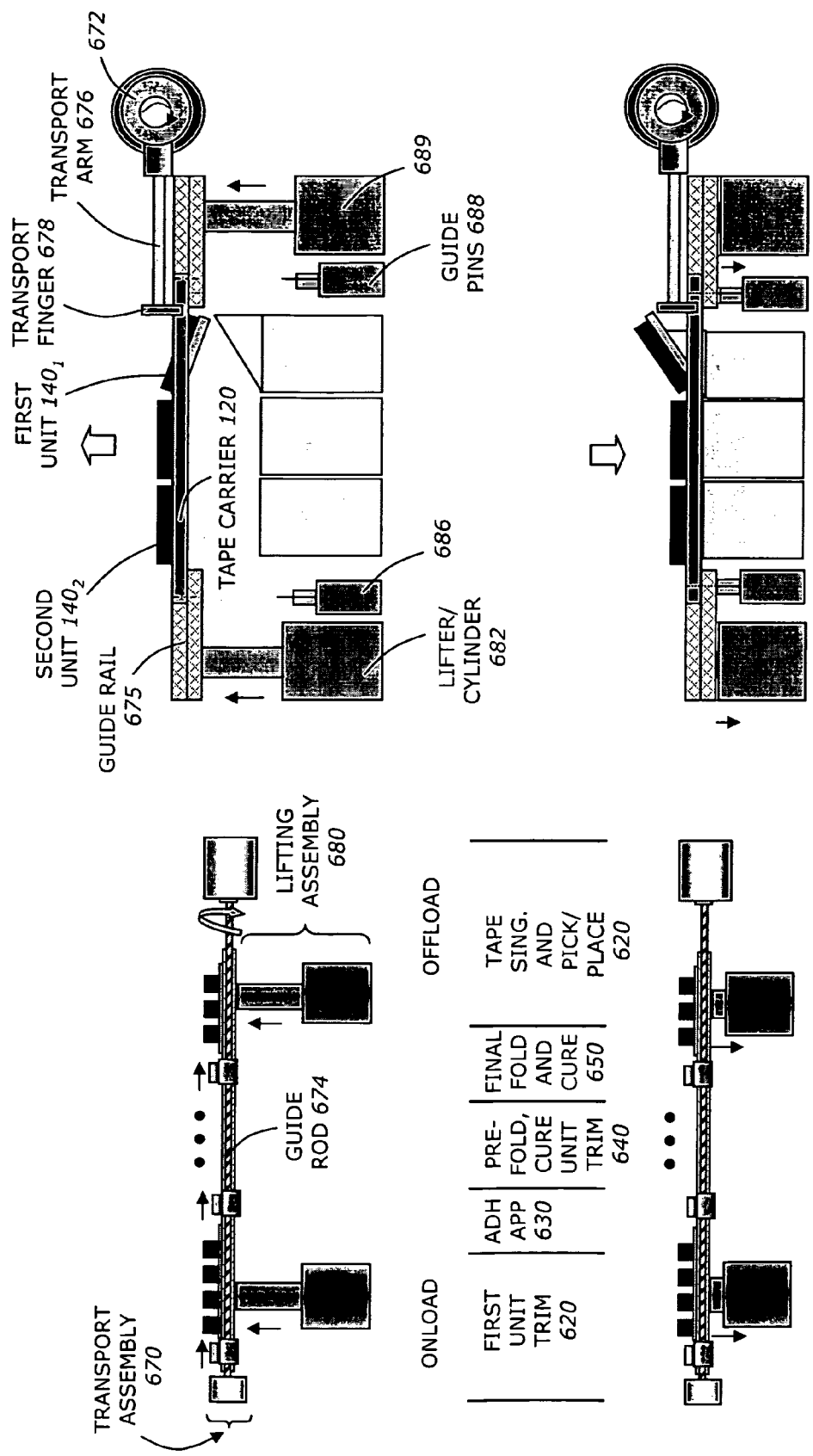
FIG. 6 is a diagram illustrating a packaging assembly line for folded-stack μBGA packaged devices according to one embodiment of the invention.

FIG. 6 is a diagram illustrating a packaging assembly line 600 for folded-stack μBGA packaged devices according to one embodiment of the invention. The assembly line 600 includes a first unit trim station 620, an adhesive application station 630, a prefold, cure, and second trim station 640, a final fold and cure station 650, and a flex tape singulation and pick and place station 660, a transport assembly 670, and a lifting assembly 680.

The transport assembly 670 rolls the tape carrier 120 through the stations for processing. The tape carrier 120 carries a number of strips of flexible tape as described in FIG. 1. The process is progressive or pipeline such that when one strip is processed by one station, another strip is processed at another station at the same time. The assembly line starts at the ON LOAD area where the packaged devices on the flexible tape are loaded into the tape carrier 120. As the tape carrier 120 progresses through the stations, the packaged devices are processed and eventually become a folded-stack μBGA devices to be transferred or delivered to a tray at the OFF LOAD area. The process is efficient as the tape carrier 120 fully enters the stations, all the stations are busy processing each phase of the process.

The transport assembly 670 includes a rotator 672, a guide rod 674, a guide rail 675, a transport arm 676, and a transport finger 678. The rotator 672 rotates to advance the guide rod 674 with screw type in a linear motion along the guide rail 675 to move the tape carrier 120 through the processing stations. The lifting assembly 680 moves the tape carrier 120 up and down to allow punching the strip out to be placed on the folding base unit 360. The lifting assembly 680 has two rows of lifters/cylinders 682 and 684 placed along the stations and two rows of guide pins 686 and 688. The number of lifters/cylinders and guide pins along each row depends on the space and processing requirements of the manufacturing plant. When the lifters/cylinders 682 and 684 are in extended, or up position, the tape carrier 120 is transported to the next station one unit pitch at a time via the transport finger 678. When the lifters/cylinders 682 and 684 are in the home, or down position, the tape carrier 120 is not transported. During this time, the pre-cut, adhesive dispense, folding, and unit singulation are done simultaneously at all the processing stations.

The packaged devices on the tape carrier may be arranged as 3×N where N is the number of columns or strips. The number of rows may not be limited to three. Depending on the folding configuration, the tool assembly shown in FIG. 3 may be modified to accommodate different arrangements.

The exact spacing of the stations depends on the particular set-up of the assembly line. Regardless of the spacing or distance between the stations, each strip on the tape carrier 120 goes through all 6 stations. Typically, the processing times of the stations are approximately equal so that the tape carrier 120 can be moved at regular or uniform speed. However, as is known by persons of ordinary skill, the transport assembly 670 can be controlled to have non-uniform speed.

Figure 7A:
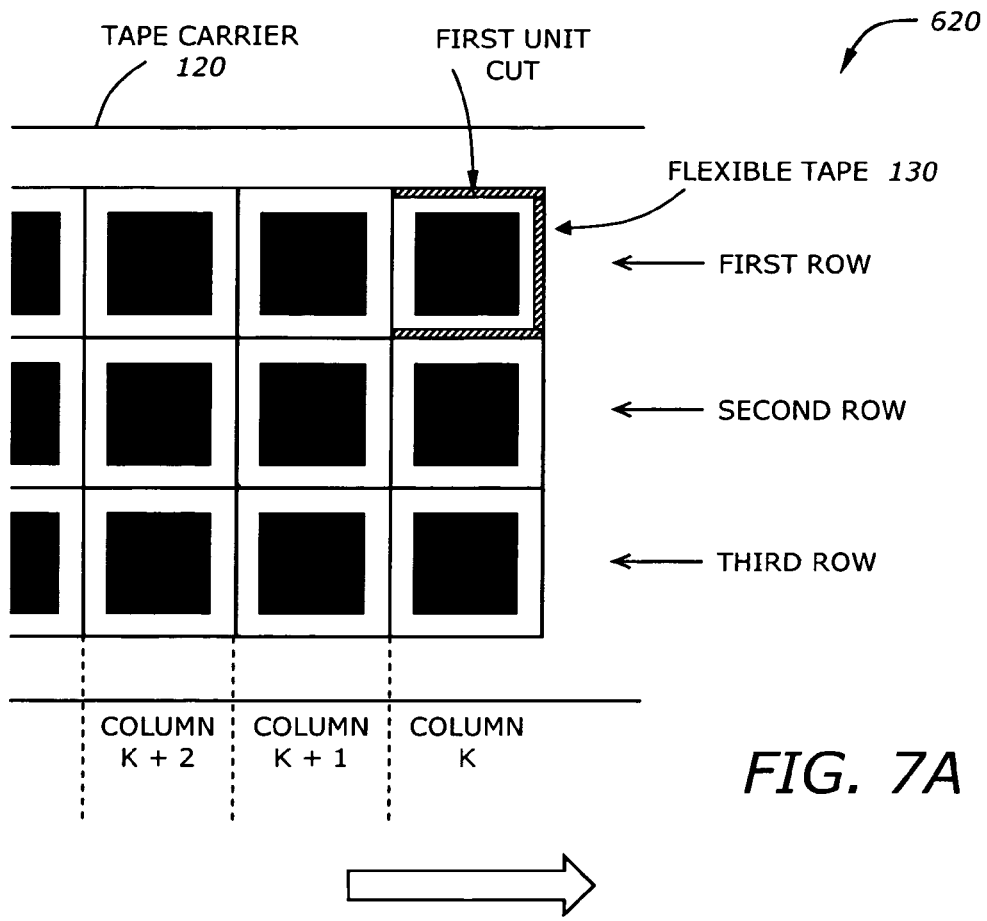
FIG. 7A is a diagram illustrating a first unit trim station in the packaging assembly line shown in FIG. 6 according to one embodiment of the invention.

FIG. 7A is a diagram illustrating a first unit trim station 620 in the packaging assembly line shown in FIG. 6 according to one embodiment of the invention.

In the first unit trim station 620, the first unit of a column or strip is trimmed, cut, or punched out. The first unit corresponds to the first row. When the first unit is trimmed and punched out, it is bent downward with respect to the horizontal direction. The strip is then moved to the adhesive application station 630.

Figure 7B:
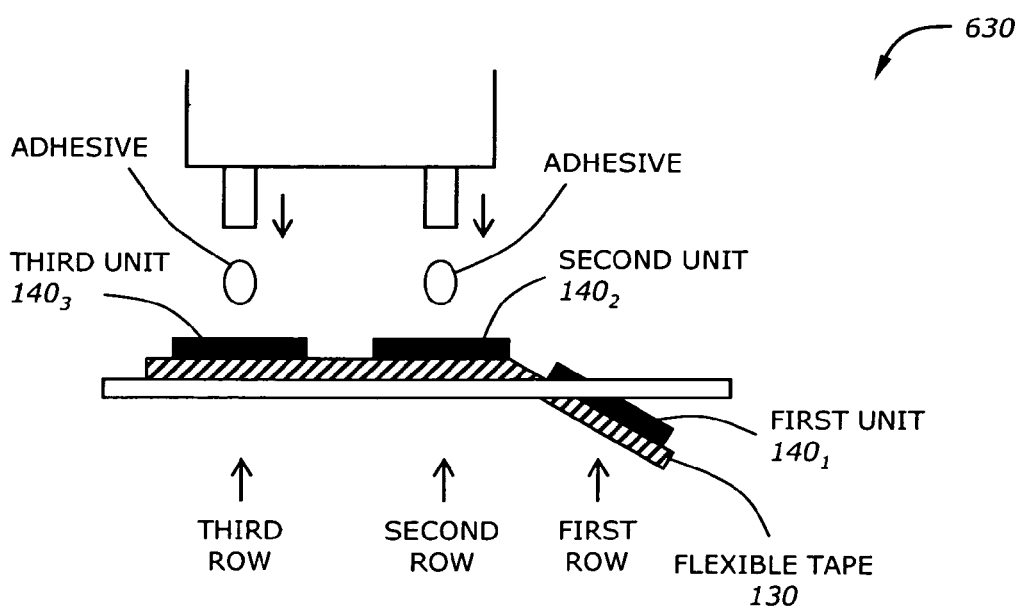
FIG. 7B is a diagram illustrating an adhesive application station in the packaging assembly line shown in FIG. 6 according to one embodiment of the invention.

FIG. 7B is a diagram illustrating an adhesive application station 630 in the packaging assembly line shown in FIG. 6 according to one embodiment of the invention.

In the adhesive application station 630, the adhesives are dispensed on the surface of the second unit $140_2$ and the third unit $140_3$. The first unit $140_1$ is bent downward. The adhesive can be dispensed by an adhesive dispenser located above the units. Then, the tape carrier 120 moves the strip to the first folding and second unit trim station 640.

Figure 7C:
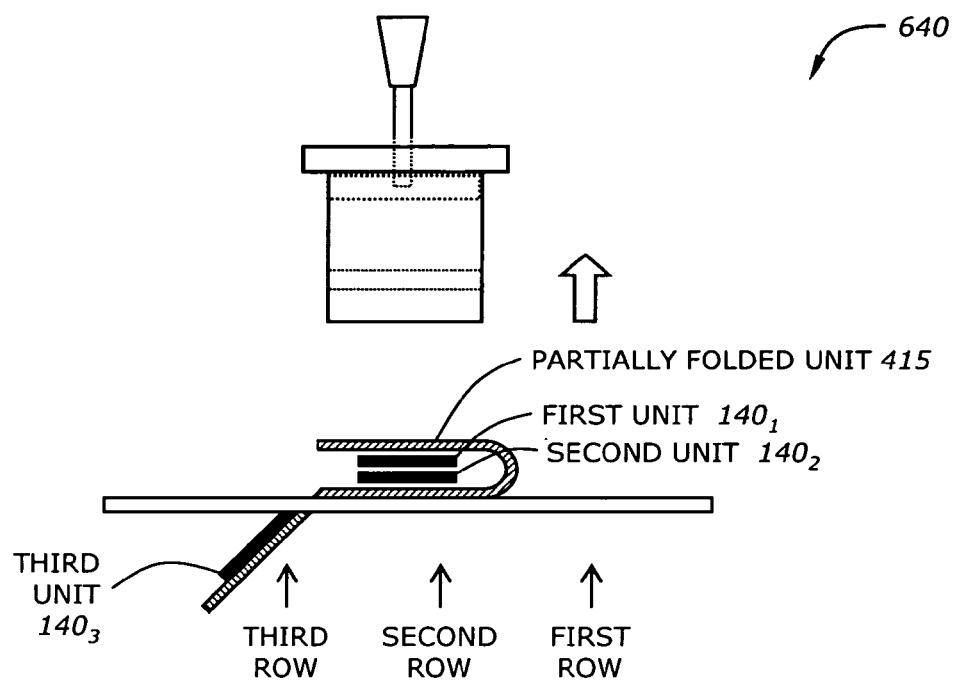
FIG. 7C is a diagram illustrating a first folding and second unit trim station in the packaging assembly line shown in FIG. 6 according to one embodiment of the invention.

FIG. 7C is a diagram illustrating a first folding and second unit trim station 640 in the packaging assembly line shown in FIG. 6 according to one embodiment of the invention. Note that the term "pre-fold" and "final fold" folding phase may be replaced by "first folding phase" or "second folding phase".

In the first folding and second unit trim station 640, the strip is processed by the tool assembly as shown in FIG. 4A. The first unit $140_1$ is folded on top of the second unit $140_2$. The plunger unit affixes the first unit $140_1$ to the second unit 1402 with the adhesive dispensed on the surface of the second unit $140_2$. The plunger unit then cures the adhesive. The affixed first and second units $140_1$ and $140_2$ form the partially folded unit 435. At the same time, the third unit $140_3$ is trimmed, cut, and punched out. The strip is then moved to the second folding station 650.

Figure 7D:
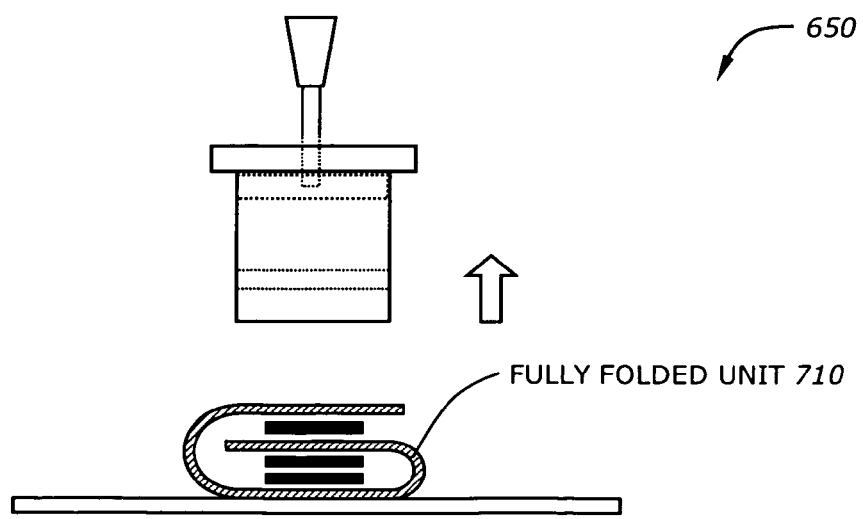
FIG. 7D is a diagram illustrating a second folding station in the packaging assembly line shown in FIG. 6 according to one embodiment of the invention.

FIG. 7D is a diagram illustrating a second folding station 650 in the packaging assembly line shown in FIG. 6 according to one embodiment of the invention.

In the second folding station 650, the strip is processed by the tool assembly as shown in FIG. 4B. The third unit $140_3$ is then folded on top of the partially folded unit. The plunger assembly then affixes the third unit $140_3$ to the partially folded unit 435 with the adhesive dispensed on the surface of the third unit $140_3$. The plunger assembly then cures the adhesive. The affixed third unit $140_3$ and the partially folded unit form a fully folded unit 710. Then, the strip with the fully folded unit 710 is moved to the flex tape singulation and pick and place station 660.

Figure 7E:
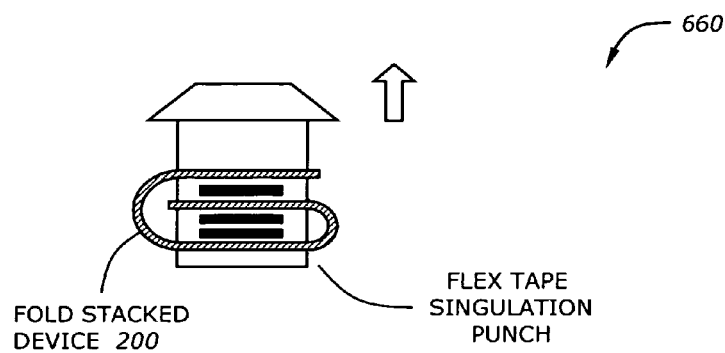
FIG. 7E is a diagram illustrating a tape de-dambar and pick and place station in the packaging assembly line shown in FIG. 6 according to one embodiment of the invention.

FIG. 7E is a diagram illustrating a flex tape singulation and pick and place station 660 in the packaging assembly line shown in FIG. 6 according to one embodiment of the invention.

The flex tape singulation and pick and place station 660 removes or detaches the flexible tape from the fully folded unit to form a folded-stack packaged device. The pick and place station then picks the folded-stack package device and transfers to the tray at the OFF LOAD area.

Figure 8:
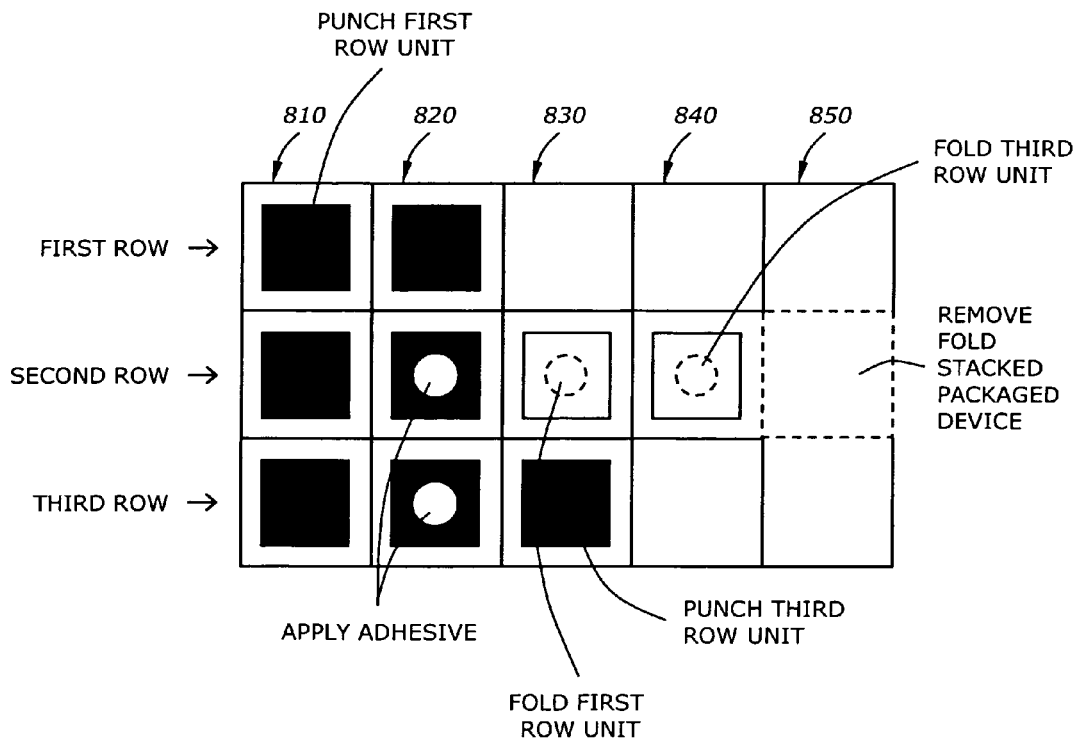
FIG. 8 is a diagram illustrating a top view of a packaging assembly line for folded-stack μBGA packaged devices according to one embodiment of the invention.

FIG. 8 is a diagram illustrating a top view of a packaging assembly line for folded-stack μBGA packaged devices according to one embodiment of the invention.

As seen from the top, at any time, the six stations process six strips or columns 810, 820, 830, 840, 850, and 860 on the flexible tape on the tape carrier. The strip 810 is processed by the first unit trim station 620 as shown in FIG. 7A. The strip 820 is processed by the adhesive application station 630 as shown in FIG. 7B. The strip 830 is processed by the first folding and second unit trim station 640 as shown in FIG. 7C. The strip 840 is processed by the second folding station 650 as shown in FIG. 7D. The strip 850 is processed by the flex tape singulation and pick and place station 660 as shown in FIG. 7E. At the end of the assembly line, the final folded-stack packaged device located in the second row is removed and transferred to the OFF LOAD area.

Figure 9:
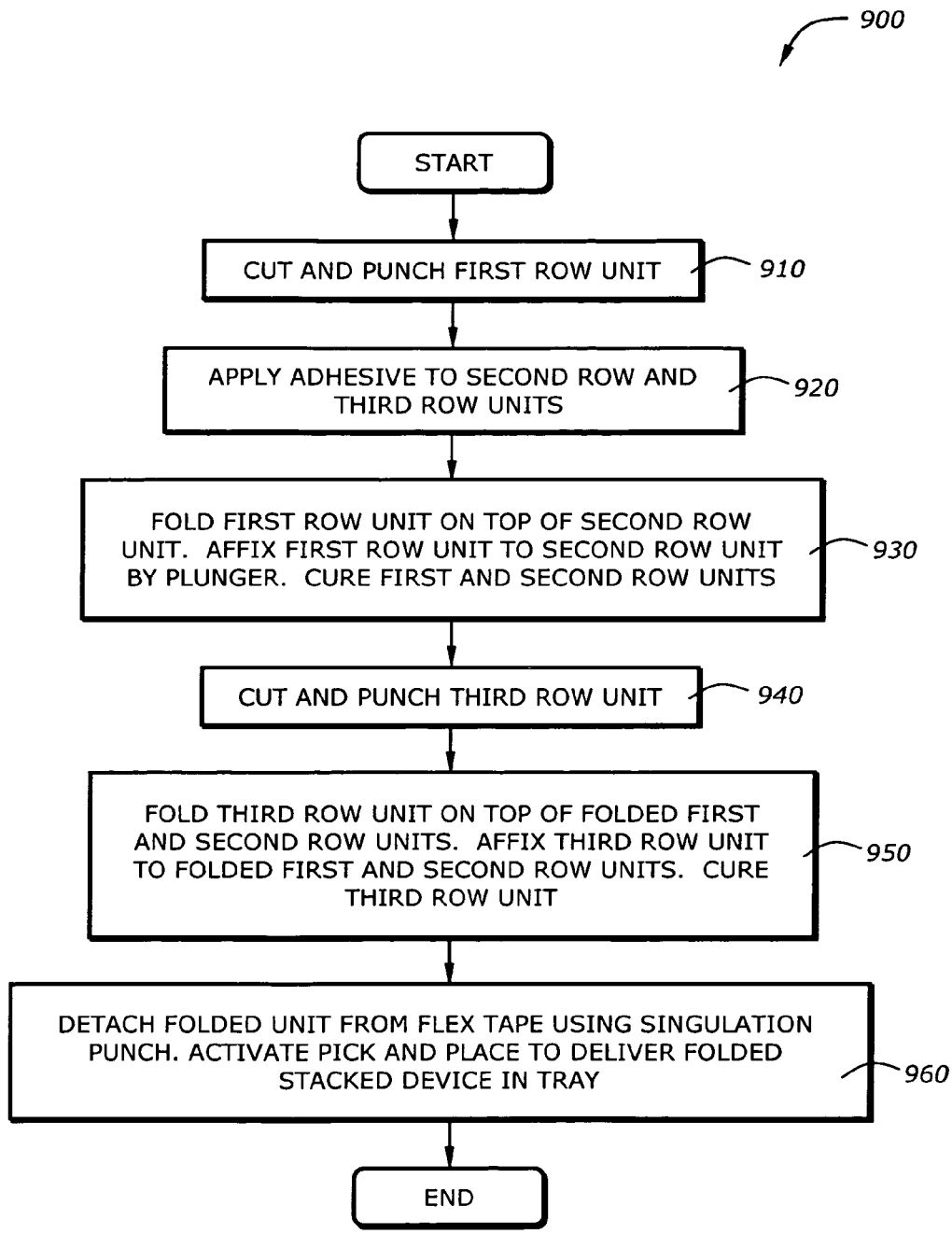
FIG. 9 is a flowchart illustrating an assembly process for folded-stack μBGA packaged devices according to one embodiment of the invention.

FIG. 9 is a flowchart illustrating an assembly process 900 for folded-stack μBGA packaged devices according to one embodiment of the invention.

Upon START, the process 900 cuts and punches the first unit from the strip of the flexible tape (Block 910). Next, the process 900 applies adhesive to the second and third units (Block 920). Then, the process 900 folds the first unit on top of the second unit, affixes the first unit to the second unit with adhesive, and thermally cures the adhesive and the first and second units (Block 930). The affixed first and second units form a partially folded unit.

Next, the process 900 cuts and punches the third unit from the strip (Block 940). Then, the process 900 folds the third unit on top of the partially folded unit, affixes the third unit to the partially folded unit with adhesive, and thermally cures the third unit and the partially folded unit. The cured third unit and partially folded unit form a fully folded unit (Block 950). Next, the process 900 detaches the fully folded unit from the flexible tape using singulation punch, activates the pick and place mechanism to deliver the folded stack packaged device in tray in the off-load area (Block 960). The process 900 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
    folding a first unit on top of a second unit by a folding base unit, the first and second units being on a strip of a flexible tape, the strip being on the folding base unit;
    affixing the first unit to the second unit with adhesive by a plunger;
    curing the adhesive by a heating element attached to the plunger;
    securing the first and second units underneath the plunger by first and second arms positioned on first and second sides of the plunger, respectively; and
    extending the first and second arms outward to release the first and second units.

2. The method of claim 1 wherein folding the first unit on top of the second unit comprises folding a first micro ball grid array (μBGA) packaged device on top of a second μBGA packaged device.

3. The method of claim 1 further comprising affixing a first die of the first unit on a first portion the strip.

4. The method of claim 3 further comprising:
    affixing a second die of the second unit on a second portion of the strip; and
    dispensing the adhesive on a surface of the second die.

5. The method of claim 3 further comprising dispensing the adhesive on a surface of the first unit.

6. The method of claim 5 further comprising affixing a second die to a third die of the second unit, the second unit being affixed on second and third portions, respectively, of the strip.

7. The method of claim 1 wherein extending the first and second arms comprises:
    moving the plunger upward.

8. The method of claim 1 wherein the flexible tape is a double-sided polyimide tape.

9. The method of claim 1 wherein the flexible tape has a thickness from 10 μm to 75 μm.

10. The method of claim 1 wherein the first unit includes a first die.

11. The method of claim 10 wherein the second unit includes a second die.

12. The method of claim 10 wherein the second unit includes a partially folded unit having a second die and a third die affixed to each other.

\* \* \* \* \*